United States Patent
Philipp et al.

(10) Patent No.: US 7,405,964 B2
(45) Date of Patent: Jul. 29, 2008

(54) INTEGRATED CIRCUIT TO IDENTIFY READ DISTURB CONDITION IN MEMORY CELL

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/494,190

(22) Filed: Jul. 27, 2006

(65) Prior Publication Data

US 2008/0025079 A1    Jan. 31, 2008

(51) Int. Cl.
*G11C 11/00*    (2006.01)
*G11C 7/00*    (2006.01)

(52) U.S. Cl. .................. 365/163; 365/148; 365/222

(58) Field of Classification Search ........... 365/163, 365/222, 162
See application file for complete search history.

(56) References Cited

U.S. PATENT DOCUMENTS

| | | | | |
|---|---|---|---|---|
| 5,818,772 | A * | 10/1998 | Kuge | 365/201 |
| 6,707,712 | B2 | 3/2004 | Lowery | |
| 6,731,528 | B2 * | 5/2004 | Hush et al. | 365/100 |
| 7,099,190 | B2 * | 8/2006 | Noguchi et al. | 365/185.09 |
| 2004/0022085 | A1 * | 2/2004 | Parkinson et al. | 365/113 |
| 2004/0245603 | A1 * | 12/2004 | Lowrey et al. | 257/536 |
| 2004/0256694 | A1 * | 12/2004 | Kostylev et al. | 257/536 |
| 2005/0201174 | A1 * | 9/2005 | Klein | 365/222 |
| 2006/0158948 | A1 * | 7/2006 | Fuji | 365/222 |
| 2006/0227591 | A1 * | 10/2006 | Lowrey et al. | 365/148 |
| 2006/0227592 | A1 * | 10/2006 | Parkinson et al. | 365/148 |
| 2006/0233019 | A1 * | 10/2006 | Kostylev et al. | 365/163 |
| 2006/0268608 | A1 * | 11/2006 | Noguchi et al. | 365/185.09 |
| 2007/0147473 | A1 * | 6/2007 | Wolkin et al. | 374/208 |

FOREIGN PATENT DOCUMENTS

EP    1420412    5/2004

OTHER PUBLICATIONS

"Impact of crystallization statistics on data retention for phase change memories", A. Redaelli, D. Ielmini, A.L. Lacaita, F. Pellizzer, A. Pirovano and R. Bez, IEEE, Aug. 2005, 4 pgs.

"Current status of the phase change memory and its future", Stefan Lai, IEEE, IEDM 03-255, May 2003, pp. 10.1.1-10.1.4.

"A Novel Cell Technology Using N-doped GeSbTe Films for Phase Change RAM", H. Horii, J.H. Yi, H. Park, Y.H Ha, I.G. Baek, S.O. Park, Y.N. Hwang, S.H. Lee, Y.T. Kim, K.H. Lee, U-In Chung and J.T. Moon, 2003 Symposium on VLSI Technology Digest of Technical Papers, 2 pgs.

(Continued)

*Primary Examiner*—Ly D Pham
(74) *Attorney, Agent, or Firm*—Dicke, Billig & Czaja, PLLC

(57) ABSTRACT

A method of operating a phase change memory array is disclosed and includes identifying a read disturb condition associated with the phase change memory array, and performing a conditional refresh operation in response to the identified read disturb condition. A phase change memory is also disclosed and includes an array of phase change memory cells, and a read disturb system configured to identify a read disturb condition and perform a refresh operation on the array in response thereto.

23 Claims, 3 Drawing Sheets

OTHER PUBLICATIONS

"OUM—A 180 nm Nonvolatile Memory Cell Element Technology For Stand Alone and Embedded Applications", Stefan Lai and Tyler Lowrey, IEDM, 2001, 4 pgs.

"Analysis of phase-transformation dynamics and estimation of morphous-chalcogenide fraction in phase-change memories", A. Itri, D. Ielmini, Al.L. Lacaita, A. Pirovano, F. Pellizzer and R. Bez. IRPS, 2004, 7 pgs.

"Highly Scalable On-axis Confined Cell Structure for High density PRAM beyond 256Mb", S.L. Cho, J.H. Yi, Y.H. Ha, B.J. Kuh, C.M. Lee, J.H. Park, S.D. Nam, H. Horii, B.O. Cho, K.C. Ryoo, S.O. Park, H.S. Kim, U-In. Chung, J.T. Moon and B.I. Ryu, 2005 Symposium on VLSI Technology Digest of Technical Papers, 2 pgs.

* cited by examiner

INTEGRATED CIRCUIT TO IDENTIFY READ DISTURB CONDITION IN MEMORY CELL

FIELD OF INVENTION

The present invention relates generally to a phase change memory array and methods of reading and performing a conditional refresh in such a memory.

BACKGROUND OF THE INVENTION

In the case of conventional memory devices, in particular conventional semiconductor memory devices, it is sometimes common to differentiate between functional memory devices (e.g., PLAs, PALs, etc.) and table memory devices. For example, some table memory devices include ROM devices (Read Only Memory) such as PROMs, EPROMs, EEPROMs, flash memories, etc., and RAM devices (Random Access Memory or read-write memory) such as DRAMs and SRAMs.

In the case of SRAMs (Static Random Access Memory), individual memory cells consist of, for example, six transistors configured as a cross-coupled latch. In the case of DRAMs (Dynamic Random Access Memory), generally only one single, correspondingly controlled capacitive element (e.g., the gate-source capacitance of a MOSFET) is employed, wherein charge may be stored in the capacitance. The charge in a DRAM, however, remains for only a short time, and a periodic refresh must be performed, to maintain a data state. In contrast to the DRAM, the SRAM requires no refresh, and the data stored in the memory cell remains stored as long as an appropriate supply voltage is fed to the SRAM. Both SRAMs and DRAMs are considered volatile memories, wherein a data state is only retained as long as power is supplied thereto.

In contrast to volatile memory, non-volatile memory devices (NVMs), e.g., EPROMs, EEPROMs, and flash memories, exhibit a different property, wherein the stored data is retained even when the supply voltage associated therewith is switched off. This type of memory has several advantages for various types of mobile communications devices such as, for example, in an electronic rolodex on cell phones, wherein the data therein is retained even when the cell phone is turned off.

One type of non-volatile memory that has recently been developed is called resistive or resistively switched memory devices. In such a resistive memory, a memory material positioned between two appropriate electrodes (i.e., an anode and a cathode) is placed, by appropriate switching processes, in a more or less conductive state, wherein the more conductive state corresponds to a logic "1", and the less conductive state corresponds to a logic "0" (or vice versa). Suitable resistive memories can be, for example, perovskite memory, as described in W. W. Zhuamg et al., "Novell Colossal Magnetoresistive Thin Film Nonvolatile Resistance Random Access Memory (RRAM)", IEDM 2002, resistive switching in binary oxides (OxRAM), for example, as described in I. G. Baeket. al., "Multi-layer crosspoint binary oxide resistive memory (OxRAM) for post-NAND storage application", IEDM 2005, or phase change memory.

In the case of phase change memory, an appropriate chalcogenide compound (e.g., a GeSbTe or an AgInSbTe compound) may, for instance, be used as the active material that is positioned between the two corresponding electrodes. The chalcogenide compound material can be placed in an amorphous, i.e., relatively weakly conductive, or a crystalline, i.e., relatively strongly conductive state by means of appropriate switching processes, and thus behaves like a variable resistance element, which as highlighted above, may be exploited as differing data states.

In order to switch the phase change material from an amorphous state to a crystalline state, an appropriate heating current is applied to the phase change element, wherein the current heats the phase change material beyond the crystallization temperature thereof. Alternatively, the electric current can be fed through an external resistive heater in close proximity to the phase change material in order to heat the phase change material beyond its crystallization temperature. This operation is sometimes called a SET operation. Similarly, a change of state from a crystalline state to an amorphous state is achieved by application of an appropriate heating current pulse, wherein the phase change material is heated beyond the melting temperature thereof, and the amorphous state is obtained during the rapid cooling process thereof. This operation is sometimes called a RESET operation. The combination of SET and RESET operations is one means by which data can be written to a phase change memory cell.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a method of operating a phase change memory array. The method comprises identifying a read disturb condition associated with the phase change memory array, and performing a conditional refresh operation in response to the identified read disturb condition. The invention is also directed to a phase change memory that comprises an array of phase change memory cells, and a read disturb system configured to identify a read disturb condition and perform a refresh operation on the array in response thereto. The conditional refresh operation of the invention advantageously prevents read disturb conditions from affecting a data state of phase change memory cells in the array.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
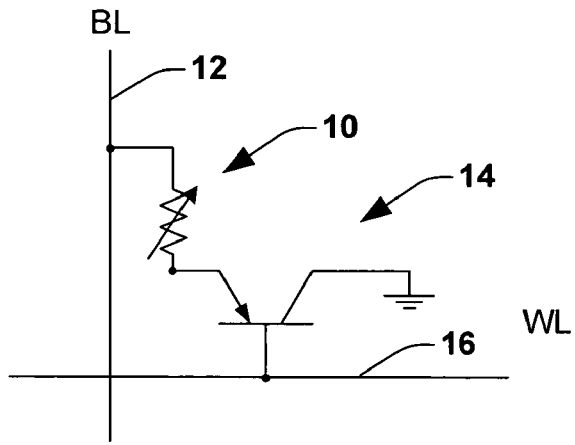
FIG. 1 is a prior art schematic diagram illustrating a conventional phase change memory cell in a NOR-type architecture.

One or more implementations of the present invention will now be described with reference to the attached drawings, wherein like reference numerals are used to refer to like elements throughout. The invention relates to a system and method of operating a phase change memory array to prevent the loss of data due to a read disturb event.

As has been highlighted above, the state of a phase change memory element is a function of resistivity, and the state of the cell can be altered by locally heating the element. Data retention for phase change memories is typically specified for a time period at 85° C., and the data retention rating is a strong function of the crystallization temperature of the phase change material within the element. For a popular phase change material, $Ge_2Sb_2Te_5$, the actual retention rating is about ten years at 105-110° C. In some applications such as automotive, temperatures may exceed 110° C. Further, in many applications the memory device is not kept at a constant temperature, but instead experiences significant changes in ambient temperature.

Due to such possibly drastic changes in chip temperature, any additional heating of the phase change element can, in some instances, negatively affect the memory. The inventors of the present invention appreciated that under special circumstances such as elevated temperature, the execution of a read operation, in which current passes through the phase change element, may cause sufficient additional heating so as to cause a disturbance in the state of the memory cell. That is, a read operation may operate to disturb the memory cell data content.

Figure 2:
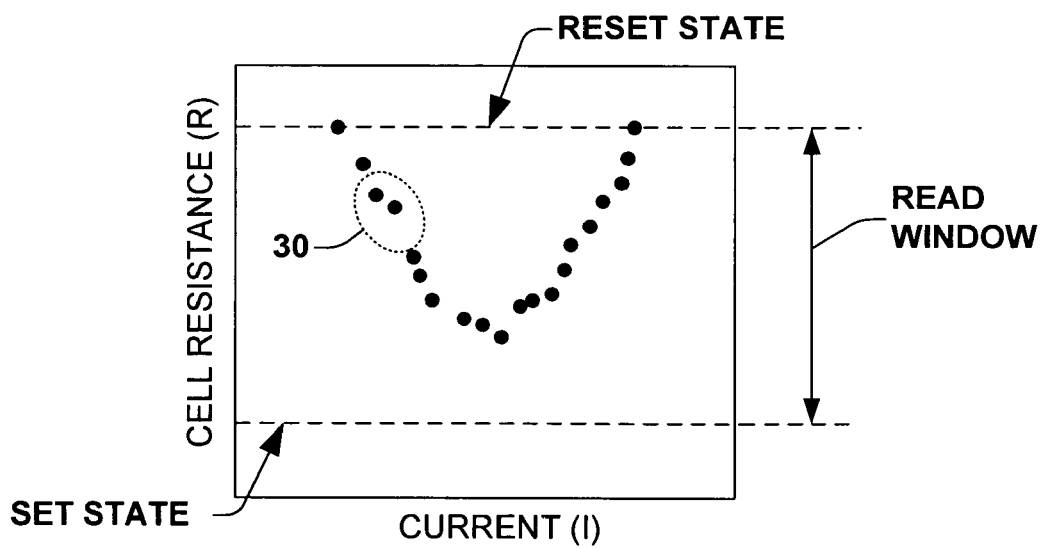
FIG. 2 is a graph illustrating how multiple read operations under special circumstances can result in a read disturb condition.

For example, referring to FIG. 2, the cell resistance (R) of a phase change element preset to a RESET state is plotted as a function of the magnitude of a short current pulse (I) passed therethrough. As can be appreciated from the graph, a number of accumulated read pulses may cause a partial setting 30 of the element. If the temperature associated with the device is high, the risk of inadvertently placing a cell into the SET state is further increased due to the lowered cell resistance and its lowered threshold voltage. Such an event is sometimes called a read disturb event and results in the loss of data.

The present invention addresses the read disturb problem by identifying a potential read disturb condition associated with the phase change memory array, and performing a refresh operation in response thereto. The refresh operation operates to fully SET or RESET, respectively, all the phase change memory cells in the array so as to eliminate any partial setting or resetting of cells, thereby preventing a read disturb event from occurring. In one embodiment, a read disturb sensor is employed to identify a potential read disturb condition prior to an occurrence thereof, so that the conditional refresh can be performed prior to a loss of data.

In order to fully appreciate various aspects of the invention, a brief description of an exemplary prior art phase change memory cell architecture is provided below. In some instances, phase change memory devices are organized in one or more arrays of phase change cells in a core area of the device, wherein each phase change memory cell is composed of a phase change memory element coupled to a selection switching device. One conventional arrangement is illustrated in prior art FIG. 1, wherein a phase change element 10 is coupled between a bit line 12 and a bipolar select transistor 14. A word line 16 is coupled to the base terminal of the transistor 14. By properly addressing the bit line 12 and word line 16 associated therewith, data may be written thereto and read therefrom. An array of phase change memory cells configured in the manner described above is sometimes called a NOR type memory array. It should be understood that the cell illustrated in FIG. 1 is merely an example and should not be interpreted as defining necessary elements for a phase change memory cell or an array for the present invention.

Figure 3:
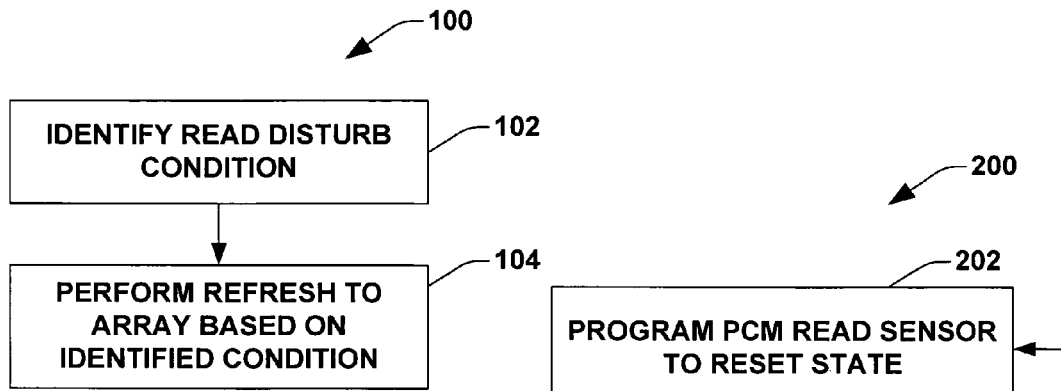
FIG. 3 is a flow chart diagram illustrating a method of operating a phase change memory array in accordance with one embodiment of the invention.

Turning now to FIG. 3, a method 100 of operating a phase change memory array is disclosed. While the method 100 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the systems illustrated and described herein as well as in association with other systems not illustrated, wherein all such implementations are contemplated as falling within the scope of the present invention and the appended claims.

In one example, the phase change memory array is configured in a NOR-type architecture, however, it should be understood that any phase change memory architecture may be employed and such alternatives are contemplated as falling within the scope of the invention. Initially, the method 10 comprises identifying a read disturb condition associated with the phase change memory array at 102. A read disturb condition is any condition of the array, wherein repeated read operations have a predetermined propensity of causing an undesired change in data state in one or more memory cells. In one embodiment of the invention, the identification at 102 comprises monitoring a thermal condition associated with one or more portions of the phase change memory array. For example, a predetermined temperature threshold may be identified, wherein an exceeding of such threshold creates a thermal environment wherein the changes of a read disturb condition occurring is sufficient to trigger some corrective or mitigating action. Therefore the present example contemplates use of one or more thermal sensors associated with the one or more portions of the array. The temperature threshold may vary based on the phase change material employed, as well as other factors.

In another example, the identification of a read disturb condition at 102 of FIG. 3 may comprise employing a customized read disturb condition sensor. Such a sensor may be employed to sense one or more parameters that correlate to a read disturb condition. In still another example, a read disturb sensor comprises a phase change memory cell that is substantially similar to or identical to the phase change memory cells in the array. In this case, a read operation is performed on the read disturb memory cell with a read condition applied thereto that causes the cell to change states if a read disturb condition exists or will soon exist. For example, a voltage or current pulse applied thereto may have a greater magnitude than a typical voltage or current pulse employed in reading the phase change memory cells in the array. In the above manner, the read disturb sensor memory cell will experience a change in state prior to such an occurrence in the array. In this sense, identification of the read disturb condition at 102 includes identifying an impending actual read disturb condition in the array before any undesired data loss.

The method 100 then continues at 104, wherein a conditional refresh operation is performed based on whether a read disturb condition is identified at 102. Thus a refresh is performed, in one example, only in those circumstances where a read disturb condition has been detected. This advantageously reduces power consumption by eliminating periodic refreshes that sometimes are used in conventional designs, and only performing such an operation when needed. In one embodiment of the invention, the refresh operation comprises reading the data in one or more portions of the array and writing that data back onto the original location(s). However, any form of refresh may be employed and such alternatives are contemplated as falling within the scope of the present invention.

Figure 4:
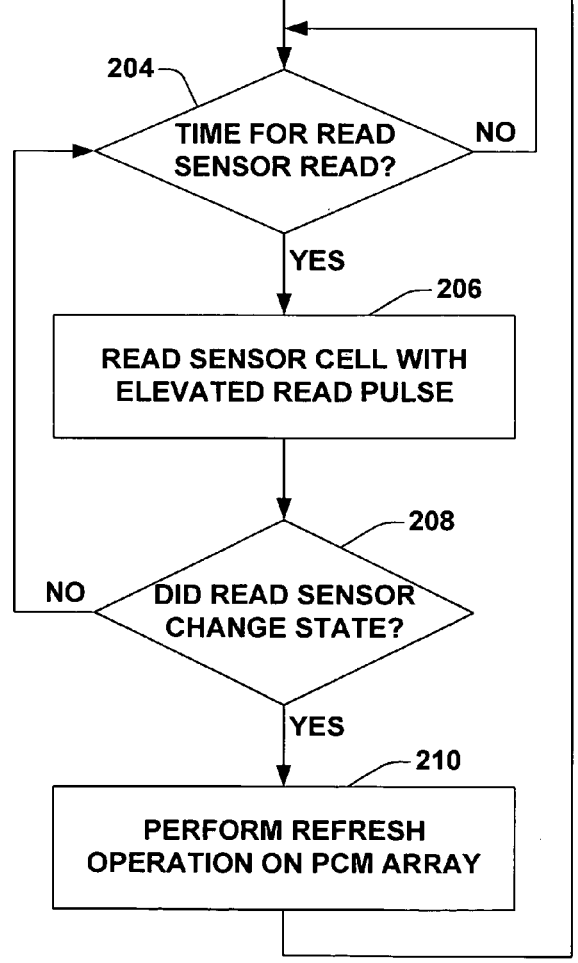
FIG. 4 is a flow chart diagram illustrating a method of operating a phase change memory array in accordance with another embodiment of the invention.

In another embodiment of the invention, a method 200 of operating a phase change memory that avoids data loss due to read disturb conditions is provided in FIG. 4. The method 200 begins at 202, wherein a phase change memory (PCM) read sensor is programmed to a RESET state. In one embodiment, the sensor comprises a phase change memory cell that is similar or identical to the phase change memory cells in the array. Any manner of addressing and programming the sensor may be employed, and all such variations are contemplated as falling within the scope of the present invention.

The method 200 continues at 204, wherein a query is made whether it is time to read the sensor. In one example, the read sensor is read concurrently with each read cycle operation associated with the array, however, more generally such a read may occur once every "n" array reads, wherein "n" is an integer greater than zero (0). If a determination is made at 204 not to perform a sensor read (NO at 204), the method 200 returns to the query as illustrated. If a determination is made to perform the sensor read (YES at 204), the read sensor read is performed at 206.

In one embodiment of the invention, the read sensor read operation is performing using an elevated read pulse. In one example, an elevated read pulse comprises a voltage or current pulse similar in duration to a read pulse used to read the phase change memory cells in the array, but having a higher voltage or current magnitude than the typical read pulse. In the above manner, any localized heating of the phase change material in the read sensor is greater than that experienced by cells in the array. Therefore if a read disturb condition is imminent, such condition will occur at the read sensor before any of the array memory cells. Consequently, the read sensor of the present invention is operable to flag a potential read disturb problem before loss of any data in the array.

Continuing at 208, a query is made whether the read disturb sensor changed state in response to the elevated read pulse. If not (NO at 208), then no read disturb condition is imminent and the method 200 returns to 204 to wait until the next read sensor read time. If, however, the read sensor does experience a change in state (YES at 208), then a read disturb condition has been identified, and the method 200 then proceeds to 210, wherein a refresh operation is then performed on the array of phase change memory cells. In one embodiment of the invention, a refresh operation comprises reading the data from all of the phase change memory cells in the array, and then writing the data back into the respective memory cell locations.

As can be seen from the method 200, the refresh operation is conditional, based on whether the read sensor identifies a read disturb condition at 208. Therefore the method of the present invention advantageously reduces the power consumption of the memory device compared to conventional solutions that periodically performed a refresh in a blind fashion.

In the above examples, the methods 100 and 200 are performed in the context of the entire memory cell array. Alternatively, the memory array may be divided into a plurality of sectors, wherein each sector may have its own respective read disturb sensor. In such an embodiment, the conditional refresh operations are performed only for those sectors in which read disturb conditions are identified, as opposed to performing a refresh operation on the entire array.

In another embodiment of the invention, the methods 100 and 200 may be employed in conjunction with multi-level or multi-bit phase change memory devices. In a multi-bit memory cell, more than two data states are associated with the variations in conductivity in the phase change material. In such devices that have smaller read margins, the present invention can be even more advantageous. In one example, the read disturb condition is associated with an intermediate state of the multi-bit or multi-level phase change memory cells, and preferably is the intermediate state that is most susceptible to an inadvertent change of state due to a read operation being performed thereon.

Therefore in one embodiment of the invention, a read disturb sensor comprises a multi-bit phase change memory cell that is programmed to an intermediate state that lies between the SET state and the RESET state. The read sensor is then read with a read voltage or current pulse that has a value greater than a read voltage or current applied to the cells in the array. A determination is then made whether the state of the read disturb sensor has left its predetermined resistance range and therefore has changed to another state. If so, a refresh operation is performed on the entire array or on an individual sector, as highlighted above.

Figure 5:
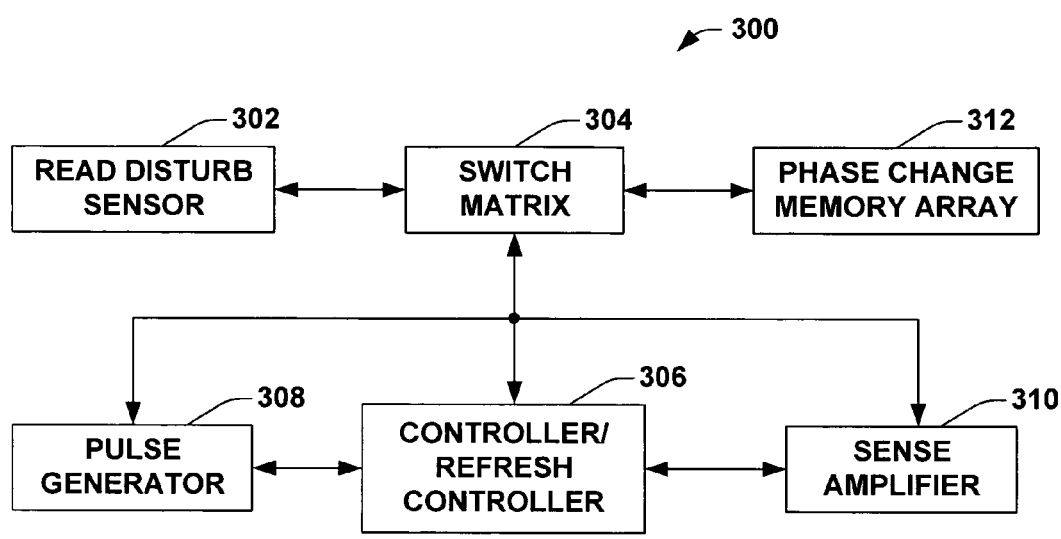
FIG. 5 is a block diagram illustrating a system for operating a phase change memory array in accordance with an embodiment of the invention.

According to yet another embodiment of the invention, a phase change memory system is provided, for example, as illustrated in FIG. 5 at reference numeral 300. The system 300 is operable to identify read disturb conditions prior to such a condition causing loss of data in the array, and perform a refresh operation upon the read disturb condition identification.

The system 300, in one example, comprises a read disturb sensor 302, a switch matrix 304, a refresh controller 306, a pulse generator 308, a sense amplifier 310, and a phase change memory array 312 (or a sector associated with such an array). In one embodiment, the read disturb sensor 302 comprises a thermal sensor that is configured to measure a thermal condition or other condition associated with one or more sectors of the array 312. In another embodiment, the read disturb sensor 302 comprises a phase change memory cell that is similar or identical to the memory cells in the array. Alternatively, any type of sensor structure that is operable to sense a read disturb condition may be employed and is contemplated as falling within the scope of the present invention.

In one embodiment of the invention, the refresh controller 306 is configured to receive data from the read disturb sensor 302, directly or indirectly, and initiate a refresh operation to the memory array 312 when a read disturb condition is detected. In the present example, the refresh controller is part of the general chip controller, however, it is contemplated that a dedicated controller circuit could be employed and such alternatives are contemplated as falling within the scope of the invention.

In one particular embodiment of the invention, where the read disturb sensor 302 comprises a phase change memory cell, the refresh controller 306 is operable to RESET the sensor cell. For example, the refresh controller 306 controls the switch matrix 304 to couple the read disturb sensor 302 to the pulse generator 308, and the pulse generator then generates the RESET pulse under the direction of the controller 306.

In one embodiment of the invention, the refresh controller 306 determines the timing in which the read disturb sensor 302 is queried. In one example, the controller 306 queries the sensor 302 every "$n^{th}$" array read, wherein "n" is an integer greater than zero (0). Alternatively, the controller 306 dictates a query time that is independent of the array reads, and instead is associated with another variable that advantageously correlates with potential read disturb conditions.

At each sensor read time, the controller 306 instructs the pulse generator 308 to generate a read sensor pulse (voltage or current), wherein the pulse is an elevated pulse having a value greater than that employed in a normal read of the array 312. The pulse generator 308 then provides the elevated read pulse to the read sensor 308 via the switch matrix 304. The refresh controller 306 then couples the sensor amplifier 310 to the read sensor 302 via the switch matrix 304 and the state of the sensor is read. In one example, the actual elevated read pulse may have altered the state and depending on the speed of the sense amplifier, the read sensor may need to be read twice.

The refresh controller 306 then determines the state of the read sensor 302 via the sense amplifier 310. If the state has changed, then a read disturb condition has been identified and the controller initiates a refresh of the phase change memory array 312 via the switch matrix 304. As highlighted above, the system 300 may operate to refresh the entire array, or a sensor may be employed with each sector of the array, and conditional refreshes may then be performed by sector as opposed to the entire array.

In addition, as highlighted above, the system 300 of FIG. 5 may also be used in conjunction with multi-bit phase change memory devices. In such an instance, instead of programming the read sensor 302 to the RESET state, the sensor is programmed to an intermediate state between the SET and RESET states. Preferably, an intermediate state is selected (if multiple intermediate states are available) that is most susceptible to read disturb conditions. In such a case, the refresh controller 306 is operable to read the read sensor upon an application of an elevated read pulse, and if a change of state is identified, a refresh operation on the array 312 (or a sector of the array) is initiated.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of operating a resistivity changing memory cell, comprising:
    reading a resistivity changing sensor memory cell with a read operation that is different than a read operation associate with the resistivity changing memory cell;
    identifying a read disturb condition associated with the resistivity changing memory cell if the different read operation caused a disturbance of data in the read resistivity changing sensor memory cell; and
    performing a refresh operation in response to the identified read disturb condition.

2. The method of claim 1, wherein identifying the read disturb condition comprises detecting a thermal condition associated with the resistivity changing memory cell that increases a probability of a read operation causing a disruption of data in the resistivity changing memory cell.

3. A method of operating a phase change memory array, comprising:
    sensing a read disturb condition; and
    performing a refresh operation when the read disturb condition is sensed,
    wherein sensing the read disturb condition comprises:
    programming a read disturb phase change memory cell to the reset state;
    performing a read disturb read operation on the read disturb phase change memory cell with a read operation that is different than a read operation associated with a phase change memory cell; and
    determining whether the read disturb condition exists based on whether the read disturb operation caused the read disturb phase change memory cell to have a resistance lower than a predetermined value.

4. The method of claim 3, wherein performing a read disturb read operation comprising applying a voltage or current pulse to the read disturb phase change memory cell that is greater than a voltage or current pulse applied to phase change memory cells in the array in a read operation.

5. The method of claim 3, wherein the read disturb condition is sensed at a time associated with each read cycle of the phase change memory array.

6. The method of claim 3, wherein performing the refresh operation comprises:
    reading data from each phase change memory cell in a portion of the phase change memory array; and
    writing the read data back into each phase change memory cell, respectively.

7. The method of claim 6, wherein the data is read from each phase change memory cell in the entire phase change memory array.

8. A method of operating a multi-bit phase change memory array, comprising:
    sensing a read disturb condition associated with one of the multiple available states of a multi-bit phase change memory cell; and
    performing a refresh operation when the read disturb condition is sensed;
    wherein sensing a read disturb condition includes reading a phase change sensor memory cell with a read operation that is different than a read operation associate with the multi-bit phase change memory cell, and sensing the read disturb condition if the different read operation caused a disturbance of data in the phase change sensor memory cell.

9. The method of claim 8, wherein the read disturb condition is associated with an intermediate state of the multi-bit phase change memory cell that lies between the set state and the reset state.

10. The method of claim 9, wherein the intermediate state comprises one of a plurality of available intermediate states that is most susceptible to an inadvertent change of state due to a read operation performed thereon.

11. The method of claim 8, wherein performing the refresh operation comprises:

reading data from each multi-bit phase change memory cell in a portion of the multi-bit phase change memory array; and writing the read data back into each multi-bit phase change memory cell, respectively.

12. The method of claim 11, wherein the data is read from each multi-bit phase change memory cell in the entire multi-bit phase change memory array.

13. An integrated circuit, comprising:

a resistivity changing memory cell; and a read disturb system configured to identify a read disturb condition and perform a refresh operation on the memory cell in response thereto, wherein the read disturb system is configured to identify the read disturb condition by reading a resistivity changing sensor memory cell with a read operation that is different than a read operation associated with the resistivity changing memory cell, and identifying the read disturb condition if the different read condition caused a disturbance of data in the read resistivity changing sensor memory cell.

14. The integrated circuit of claim 13, wherein the read disturb system is configured to identify the read disturb condition by detecting a thermal condition associated with the memory cell.

15. A phase change memory system, comprising:

an array of phase change memory cells;

a phase change memory read sensor;

a refresh controller configured to perform a refresh operation on the array of phase change memory cells when the read sensor indicates a read disturb condition; and a pulse generator configured to generate and provide a read disturb signal to the phase change memory read sensor.

16. The phase change memory system of claim 15, wherein the phase change memory read sensor comprises a phase change memory cell, and wherein the read disturb signal causes a change in resistance of the phase change memory read sensor when the read disturb condition exists.

17. The phase change memory system of claim 15, wherein the pulse generator is further configured to generate a reset pulse signal to force the phase change memory read sensor to a reset state.

18. A phase change memory system, comprising:

an array of phase change memory cells;

a phase change memory read sensor;

a refresh controller configured to perform a refresh operation on the array of phase change memory cells when the read sensor indicates a read disturb condition; and a sense amplifier configured to sense a state of the phase change memory read sensor during a read operation, and communicate the sensed state to the refresh controller.

19. The phase change memory system of claim 15, wherein the phase change memory cells comprise multi-bit phase change memory cells.

20. The phase change memory system of claim 19, wherein the phase change memory read sensor comprises a multi-bit phase change memory cell.

21. The phase change memory system of claim 20, wherein the read sensor is initially set to an intermediate state lying between a set state and a reset state, and wherein a read disturb condition is indicated when the intermediate state leaves a predetermined resistance range.

22. A phase change memory system, comprising:

an array of phase change memory cells; and means for detecting a read disturb condition associated with the array and performing a refresh operation in response thereto, the means for detecting further comprising:

means for reading a resistively changing sensor memory cell with a read operation that is different than a read operation associated with the resistively changing memory cell, and means for identifying the read disturb condition if the different read condition caused a disturbance of data in the read resistively changing sensor memory cell.

23. The phase change memory system of claim 22, wherein the detecting means further comprises read disturb sensor means for detecting the read disturb condition.

* * * * *